(12) United States Patent
Roessler (10) Patent No.: US 10,356,906 B2
(45) Date of Patent: Jul. 16, 2019

(54) METHOD OF MANUFACTURING A PCB INCLUDING A THICK-WALL VIA

(71) Applicant: ABB Schweiz AG, Baden (CH)

(72) Inventor: Robert Joseph Roessler, Wylie, TX (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 15/188,681

(22) Filed: Jun. 21, 2016

(65) Prior Publication Data
US 2017/0367185 A1    Dec. 21, 2017

(51) Int. Cl.
*H01K 3/10*      (2006.01)
*H05K 1/18*      (2006.01)
(Continued)

(52) U.S. Cl.
CPC ........... *H05K 1/181* (2013.01); *H05K 1/0265* (2013.01); *H05K 1/0298* (2013.01); *H05K 1/113* (2013.01); *H05K 1/115* (2013.01); *H05K 3/0047* (2013.01); *H05K 3/303* (2013.01); *H05K 3/424* (2013.01); *H05K 3/429* (2013.01);
(Continued)

(58) Field of Classification Search
CPC ........ H05K 1/181; H05K 3/423; H05K 3/429; H05K 1/0298; H05K 3/303; H05K 3/0047; H05K 3/424; H05K 1/113; H05K 2201/1003; H05K 2201/10166;
(Continued)

(56) References Cited

U.S. PATENT DOCUMENTS

| 5,509,200 A * | 4/1996 | Frankeny ............ H01L 23/5385 |
| | | 29/852 |
| 6,696,910 B2 * | 2/2004 | Nuytkens ............ H01F 17/0033 |
| | | 29/602.1 |

(Continued)

FOREIGN PATENT DOCUMENTS

| JP | H04258198 A | 9/1992 |
| JP | 2001177238 A | 6/2001 |

(Continued)

OTHER PUBLICATIONS

Basista, D. et al., "Using Heavy Copper and Extreme Copper in PCB Design and Fabrication for Maximum Reliability," www.epectec.com/downloads/Article-EXTREME-Copper-PCBs.pdf, accessed Jun. 13, 2016.

(Continued)

*Primary Examiner* — Donghai D Nguyen
(74) *Attorney, Agent, or Firm* — Barnes & Thornburg LLP (57) ABSTRACT

A method of manufacturing a printed circuit board includes providing a printed circuit board (PCB) substrate including at least one insulating layer and first and second conductive layers separated from one another by the at least one insulating layer, forming a first via hole in the PCB substrate extending from the first conductive layer to the second conductive layer, where the first via hole is defined by a first sidewall of the PCB substrate, forming a second via hole in the PCB substrate, where the second via hole is defined by a second sidewall of the PCB substrate, and selectively plating the first sidewall and the second sidewall to form a first via and a second via, respectively, where the first via and the second via have different via sidewall thicknesses.

12 Claims, 6 Drawing Sheets

(51) Int. Cl.
*H05K 1/02* (2006.01)
*H05K 1/11* (2006.01)
*H05K 3/00* (2006.01)
*H05K 3/30* (2006.01)
*H05K 3/42* (2006.01)

(52) U.S. Cl.
CPC ............... *H05K 2201/098* (2013.01); *H05K 2201/1003* (2013.01); *H05K 2201/10166* (2013.01); *H05K 2203/1476* (2013.01); *Y10T 29/49165* (2015.01)

(58) Field of Classification Search
CPC ............. H01L 23/5385; H01F 17/0033; Y10T 29/49155; Y10T 29/49165
USPC ........... 29/830, 832, 846, 852; 174/260, 262
See application file for complete search history.

(56) References Cited

U.S. PATENT DOCUMENTS

2006/0144618 A1* 7/2006 Song .................. H05K 3/423
29/852
2007/0199735 A1 8/2007 Kim et al.

FOREIGN PATENT DOCUMENTS

JP 4148477 B2 9/2008
KR 100660027 B1 12/2006

OTHER PUBLICATIONS

FLAT-WRAP: A Novel Approach to Copper Wrap Plate, http://pcb.iconnect007.com/index.php/article/36376/flat-wrap-a-novel-approach-to-copper-wrap-plate/36379/?skin=pcb, accessed Jun. 13, 2016.
"How thick is via plating?", www.eevblog.com/forum/manufacture/how-thick-is-via-plating/10/?wap2, accessed Jun. 13, 2016.
Multi-CB, "Conductor-Amapacity", www.multi-circuit-boards.eu/en/pcb-design-aid/surface/conductor-ampacity.html, accessed Jun. 13, 2016.
"Wall thickness of a via hole . . . ", www.community.cadence.com, accessed Jun. 13, 2016.
Institute for Interconnecting and Packaging Electronic Circuits, Test Methods Manual, Thickness, Plating in Holes Microohm Method, www.ipc.org/TM/2.2.13.1.pdf, accessed Jun. 13, 2016.
H. C. Chen et al., "Improvement of high current density PCB design on a high end server system," Industrial Electronics (ISIE), 2013 IEEE International Symposium on, Taipei, Taiwan, pp. 1-4, 2013.
H. C. Chen et al., "Improvement of High-Current Density PCB Design With PSU Load Balance and Redundancy on a High End Server System," in Canadian Journal of Electrical and Computer Engineering, vol. 37, No. 4, pp. 203-211, Fall 2014.
Coppola, L. et al., "Investigation on current density limits in power printed circuit boards," Applied Power Electronics Conference and Exposition, APEC 2008. Twenty-Third Annual IEEE, Austin, TX, pp. 205-221, 2008.
Ji, L. et al., "Multiphysics coupling simulation of RDE for PCB manufacturing," Circuit World, vol. 41, no. 1 (2015), pp. 20-28, Emerald Group Publishing Limited.

* cited by examiner

METHOD OF MANUFACTURING A PCB INCLUDING A THICK-WALL VIA

BACKGROUND

The field of the disclosure relates generally to printed circuit boards, and more particularly, to printed circuit boards including thick-wall conductive vias and methods of manufacturing the same.

Power electronics systems generally include a printed circuit board and a plurality of electronic components mounted to the printed circuit board. Printed circuit boards generally include a plurality of conductive traces formed from a conductive layer to provide an electrical connection between the electronic components. Some printed circuit boards have multiple conductive layers, including inner conductive layers and outer conductive layers. Additionally, some printed circuit boards include conductive vias that electrically couple two or more of the conductive layers together.

Demand for increased power density and miniaturization of power electronics system has created increased current carrying capacity and efficiency requirements for conductive vias.

At least some known methods of manufacturing printed circuit boards with high current carrying capacity conductive vias are less than optimal for certain applications. For example, at least some known methods plate or otherwise form conductive vias in a single plating process, in which every conductive via of the printed circuit board is formed. When used to form conductive vias having relatively thick sidewalls, the thickness of the outer conductive layers may be increased as a result of the plating process to the point where the printed circuit board is no longer compatible with existing miniaturization technology, such as fine pitch components. Additionally, when used to form conductive vias having different via sidewall thicknesses, known methods may result in relatively thin-wall vias having non-planar or irregular surface morphology, which may require additional processing (e.g., planarization) after via formation.

Accordingly, a need exists for printed circuit boards having thick-wall conductive vias and methods of manufacturing the same.

BRIEF DESCRIPTION

In one aspect, a method of manufacturing a printed circuit board is provided. The method includes providing a printed circuit board (PCB) substrate including at least one insulating layer and first and second conductive layers separated from one another by the at least one insulating layer, forming a first via hole in the PCB substrate extending from the first conductive layer to the second conductive layer, where the first via hole is defined by a first sidewall of the PCB substrate, forming a second via hole in the PCB substrate, where the second via hole is defined by a second sidewall of the PCB substrate, and selectively plating the first sidewall and the second sidewall to form a first via and a second via, respectively, where the first via and the second via have different via sidewall thicknesses.

In another aspect, a printed circuit board is provided. The printed circuit board includes at least one insulating layer, first and second conductive layers separated from one another by the at least one insulating layer, and a conductive via extending through the at least one insulating layer and electrically coupling the first and second conductive layers. The conductive via includes an annular via sidewall having an average radial thickness of at least 2.5 mils (0.0025 inches), and a conductive pad having an average thickness of no more than 3.2 mils (0.0032 inches).

In yet another aspect, a printed circuit board assembly is provided. The printed circuit board assembly includes at least one insulating layer, first and second conductive layers separated from one another by the at least one insulating layer, a conductive via extending through the at least one insulating layer and electrically coupling the first and second conductive layers, and an electronic component electrically coupled to the conductive via. The conductive via includes an annular via sidewall having an average radial thickness of at least 2.5 mils (0.0025 inches), and a conductive pad having an average thickness of no more than 3.2 mils (0.0032 inches). The electronic component includes a pair of conductive leads having a center-to-center spacing of less than 25 mils (0.025 inches).

Although specific features of various embodiments may be shown in some drawings and not in others, this is for convenience only. Any feature of any drawing may be referenced and/or claimed in combination with any feature of any other drawing.

DETAILED DESCRIPTION

Exemplary embodiments of printed circuit boards and methods of manufacturing printed circuit boards are described herein. The methods generally include forming at least a first via hole and a second via hole in a printed circuit board (PCB) substrate, and selectively plating sidewalls of the PCB substrate that define the first and second via holes to form a first via and a second via, respectively, such that the first via and the second via have different via sidewall thicknesses.

In contrast to some known methods of manufacturing printed circuit boards, the methods described herein selectively plate conductive vias using a multi-step plating process in which one or more via holes are formed subsequent to at least one via plating process. In some embodiments, for example, a second via hole is formed subsequent to a first plating process, and a second plating process is performed subsequent to the second via hole being formed. The methods described herein thereby facilitate forming relatively thick via sidewalls while maintaining relatively thin outer conductive layers and thin via pads. Thick-wall conductive vias have reduced electrical resistance as compared to thin-wall vias, and thereby provide lower resistive losses and generate relatively less resistive heating during operation as compared to thin-wall vias. Moreover, thick-wall conductive vias facilitate improving board space utilization. For example, conductive vias of the present disclosure may be used in place of several thin-wall vias, which occupy a disproportionately large surface area of printed circuit boards as compared to the thick-wall vias described herein. Moreover, maintaining relatively thin outer conductive layers and via pads facilitates improving the minimum obtainable feature size in the outer conductive layers (e.g., conductive trace width and/or center-to-center spacing of conductive pads), and thereby facilitates use of fine pitch components. Thus, as compared to some known printed circuit boards and methods of manufacturing printed circuit boards, the printed circuit boards and methods described herein facilitate improving the power density, component density, and the efficiency of printed circuit boards.

Figure 1:
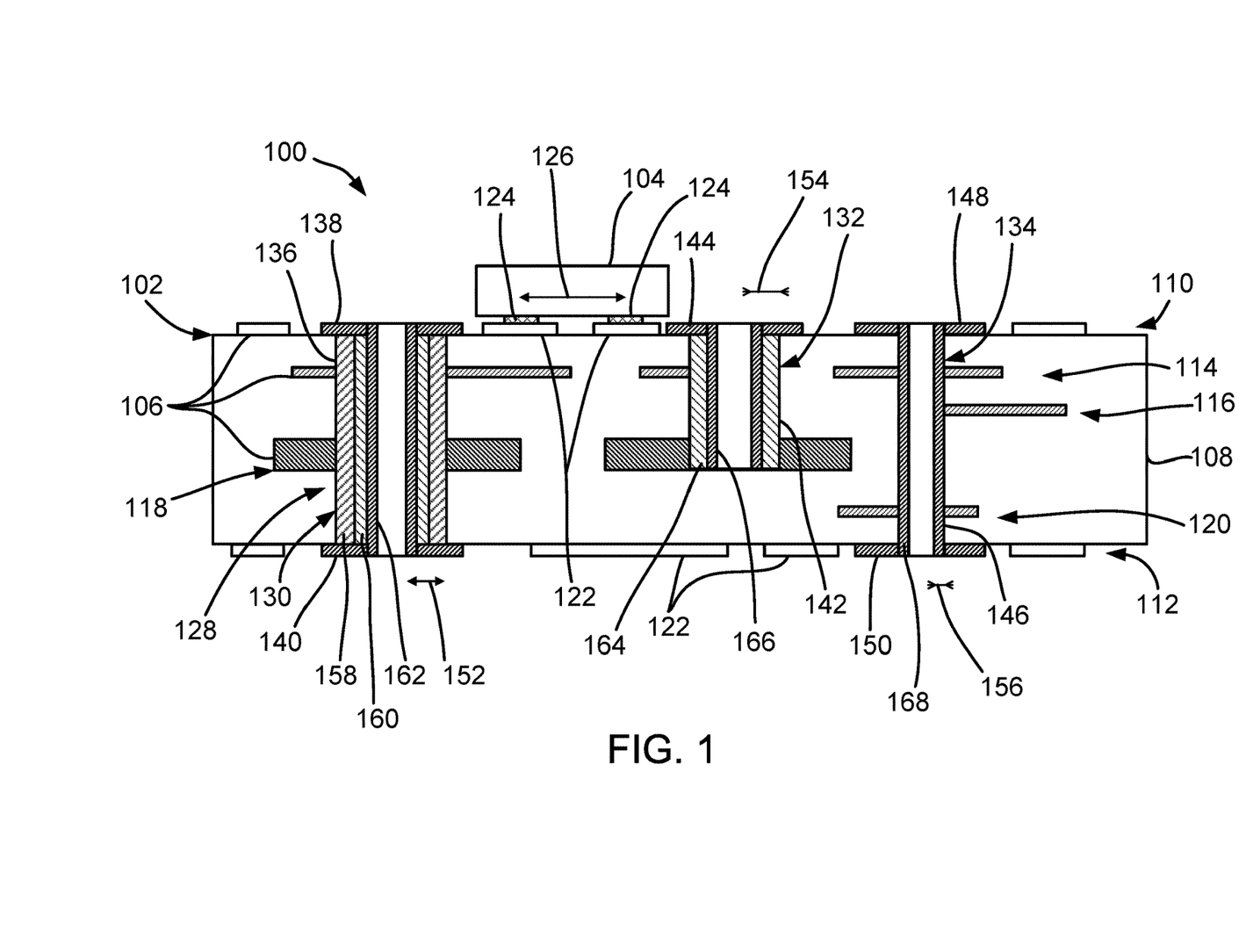
FIG. 1 is a cross-section of an exemplary printed circuit board assembly including a printed circuit board with thick-wall vias.

FIG. 1 is a cross-section of an exemplary printed circuit board (PCB) assembly 100 including a printed circuit board 102 and an electronic component 104 coupled to printed circuit board 102.

As shown in FIG. 1, printed circuit board 102 includes a plurality of conductive layers 106 coupled to an insulating member 108. Conductive layers 106 are coupled to insulating member 108 by suitable attachment means including, for example and without limitation, adhesive bonding. The plurality of conductive layers 106 includes a first conductive layer 110, a second conductive layer 112, a third conductive layer 114, a fourth conductive layer 116, a fifth conductive layer 118, and a sixth conductive layer 120.

First conductive layer 110 and second conductive layer 112 are coupled to outermost surfaces of insulating member 108, and are interchangeably referred to herein as outer conductive layers of printed circuit board 102. As shown in FIG. 1, each of first conductive layer 110 and second conductive layer 112 are patterned to define one or more conductive traces 122 in the respective first conductive layer 110 or second conductive layer 112. First conductive layer 110 and second conductive layer 112 may be patterned using any suitable patterning process including, for example and without limitation, chemical etching. First conductive layer 110 and second conductive layer 112 may include any suitable number of conductive traces that enable printed circuit board 102 to function as described herein. As described in more detail herein, the printed circuit boards and methods of the present disclosure facilitate formation of fine pitch features in the outer conductive layers of printed circuit boards. In some embodiments, for example, the center-to-center spacing between adjacent conductive traces 122 may be less than 25 mils (0.025 inches).

Third, fourth, fifth, and sixth conductive layers 114, 116, 118, and 120 are positioned within or enclosed by insulating member 108, and are interchangeably referred to herein as inner conductive layers of printed circuit board 102.

Each of conductive layers 106 may be formed from a variety of suitable electrically conductive materials including, for example and without limitation, copper, gold, silver, nickel, aluminum, and combinations thereof. In the exemplary embodiment, each of conductive layers 106 is formed from copper. In other embodiments, conductive layers 106 may be formed of different conductive materials.

As shown in FIG. 1, one or more of conductive layers 106 may have a different thicknesses or areal density than the other conductive layers 106. In some embodiments, for example, the outer conductive layers (i.e., first conductive layer 110 and second conductive layer 112) may have an average thickness of no more than 3.2 mils (0.0032 inches), no more than 2.5 mils (0.0025 inches), or even no more than 2.0 mils (0.002 inches), or an areal density of no more than 2.3 ounces per square foot, no more than 1.8 ounces per square foot, or even no more than 1.5 ounces per square foot.

Moreover, in some embodiments, one or more of the inner conductive layers (i.e., third, fourth, fifth, and sixth conductive layers 114, 116, 118, and 120) may have an average thickness of between 1.4 mils (0.0014 inches) and 7 mils (0.007 inches)

In the exemplary embodiment, each of first and second conductive layers 110 and 112 has an average thickness of about 2.5 mils (0.0025 inches), or an areal density of 1.8 ounces per square foot. Moreover, in the exemplary embodiment, each of third, fourth, and sixth conductive layers 114, 116, and 120 has an average thickness of about 1.4 mils, or an areal density of 1 ounce per square foot. Moreover, in the exemplary embodiment, fifth conductive layer 118 has a thickness of 4.2 mils (0.0042 inches), or an areal density of 3 ounces per square foot. The areal density of a conductive layer refers to the areal density of the conductive material that makes up or forms the conductive layer, exclusive of insulating material that may be disposed between portions of conductive material within the conductive layer. For example, if a conductive layer is formed by patterning (e.g., etching) a conductive sheet or foil with an areal density of 2 ounces per square foot and filling voids in the conductive layer with an insulating material, the areal density of the conductive layer would be 2 ounces per square foot.

Each of conductive layers 106 is separated from adjacent conductive layers by at least one insulating layer defined by insulating member 108. For example, first conductive layer 110 and second conductive layer 112 are separated and spaced apart from one another by at least one insulating layer defined by insulating member 108. Insulating member 108 is configured to provide electrical insulation between conductive layers 106. Insulating member 108 is formed from an electrically insulating material and has a suitable thickness to provide a desired dielectric isolation between adjacent conductive layers 106. Insulating member 108 may also be formed from a flame-retardant material, to facilitate minimizing the risk of electrical fires. Suitable materials from which insulating member 108 may be formed include, for example and without limitation, glass-reinforced epoxy composites, such as FR-4 materials, and adhesiveless laminates, such as low-flow or no-flow prepreg. In some embodiments, insulating member 108 includes a plurality of separate insulating layers. In other embodiments, insulating member 108 has a unitary construction.

Electronic component 104 is mechanically and electrically coupled to printed circuit board 102 by a pair of conductive leads 124. Each of conductive leads 124 is electrically coupled to one of conductive traces 122 in first conductive layer 110 (e.g., by soldering). The pair of conductive leads 124 has a center-to-center spacing 126, also referred to as "pitch". Although only one electronic component is shown in FIG. 1, PCB assembly 100 may include more than one electronic component. In some embodiments, electronic component 104 is a power electronic component, such as an inductor, a transformer, or a power MOSFET.

In some embodiments, printed circuit board 102 is compatible with electronic components having a relatively small center-to-center spacing, also referred to as fine pitch components. In some embodiments, for example, center-to-center spacing 126 between conductive leads 124 may be less than about 25 mils (0.025 inches), less than about 16 mils (0.016 inches), and even less than about 12 mils (0.012 inches). As described in more detail herein, outer conductive layers of printed circuit board 102, such as first and second conductive layers 110 and 112, may have a relatively small thickness in some embodiments, thereby improving the minimum obtainable feature size in the outer conductive layers and compatibility with fine pitch components.

As shown in FIG. 1, printed circuit board 102 also includes a plurality of conductive vias 128 electrically coupling two or more of conductive layers 106 together. Each of conductive vias 128 may be formed from a variety of suitable electrically conductive materials including, for example and without limitation, copper, gold, silver, nickel, aluminum, and combinations thereof. In the exemplary embodiment, each of conductive vias 128 is formed from copper. In other embodiments, conductive vias 128 may be formed of different conductive materials.

The exemplary embodiment includes three conductive vias, including a first via 130, a second via 132, and a third via 134. Other embodiments may include more than or less than three conductive vias. First via 130 extends through the entire thickness of printed circuit board 102, and electrically couples first conductive layer 110 to second conductive layer 112. First via 130 is also electrically coupled to third conductive layer 114 and fifth conductive layer 118, thereby electrically coupling first, second, third, and fifth conductive layers 110, 112, 114, and 116 together. Second via 132 extends from first conductive layer 110 to fifth conductive layer 118, and electrically couples first conductive layer 110 to third conductive layer 114 and fifth conductive layer 118. Third via 134 extends through the entire thickness of printed circuit board 102, and electrically couples first conductive layer 110 to second conductive layer 112. Third via 134 is also electrically coupled to third, fourth, and sixth conductive layers 114, 116, and 120, thereby electrically coupling first, second, third, fourth and sixth conductive layers 110, 112, 114, 116, and 120 together.

Conductive vias that extend through the entire thickness of a printed circuit board, such as first and third vias 130 and 134 are colloquially referred to as through-hole vias. Conductive vias that extend from an outer conductive layer to an inner conductive layer, such as second via 132, are colloquially referred to as blind vias. Conductive vias that extend only between two inner conductive layers are colloquially referred to as blind vias. Aspects of the present disclosure are applicable to through-hole vias, blind vias, and buried vias.

Each of conductive vias 128 includes an annular via sidewall that extends vertically through insulating member 108, and at least one conductive pad disposed within one of the outermost conductive layers (i.e., first conductive layer 110 or second conductive layer 112) of printed circuit board 102 and configured to be electrically coupled to an electronic component (e.g., by soldering).

In the exemplary embodiment, first via 130 includes a first via sidewall 136, a first conductive pad 138 disposed within the first conductive layer 110, and a second conductive pad 140 disposed within the second conductive layer 112. Second via 132 includes a second via sidewall 142 and a conductive pad 144 disposed within the first conductive layer 110. Third via 134 includes a third via sidewall 146, a first conductive pad 148 disposed within the first conductive layer 110, and a second conductive pad 150 disposed within the second conductive layer 112.

Each via sidewall 136, 142, and 146 has a respective radial thickness 152, 154, and 156 measured from the radial outermost surface of the corresponding via sidewall to the radial innermost surface of the corresponding via sidewall. In some embodiments, the radial thickness of a via sidewall may not be uniform around the entirety of the via sidewall. For example, the radial thickness of first via sidewall 136 may vary circumferentially around first via sidewall 136.

Accordingly, in some embodiments, an average radial thickness of a via sidewall is used to measure the via sidewall thickness. The average radial thickness of a via sidewall may be determined using suitable known methods for calculating average radial thickness. For example, the average radial thickness of a via sidewall may be determined by measuring the radial thickness of a via sidewall at a plurality of different locations (e.g., different circumferential locations and/or different heights), and calculating an average based on the plurality of measurements.

Embodiments of printed circuit boards described herein may have relatively thick via sidewalls and, consequently, relatively high current carrying capacity as compared to at least some known printed circuit boards. Conductive vias having thick via sidewalls (also referred to herein as thick-wall vias) facilitate improving board space utilization. For example, conductive vias of the present disclosure may be used in place of several thin-wall vias, which occupy a disproportionately large surface area of PCBs as compared to the thick-wall vias described herein. Conductive vias of the present disclosure thereby facilitate improving board space utilization. Moreover, methods of forming printed circuit boards described herein facilitate forming relatively thick via sidewalls while maintaining relatively thin outer conductive layers and thin via pads. Maintaining relatively thin outer conductive layers and via pads facilitates improving the minimum obtainable feature size in the outer conductive layers (e.g., conductive trace width and/or center-to-center spacing of conductive pads), and thereby facilitates use of fine pitch components (e.g., components having a center-to-center lead spacing of 25 mils or less).

In some embodiments, for example, one or more of via sidewalls 136, 142, and 146 may have an average radial thickness of at least 2.5 mils (0.0025 inches), at least 3 mils (0.003 inches), at least 4 mils (0.004 inches), at least 5 mils (0.005 inches), at least 6 mils (0.006 inches), and even up to about 10 mils (0.01 inches). Moreover, first conductive layer 110 and/or second conductive layer 112 may have an average thickness of no more than 3.2 mils (0.0032 inches), no more than 2.5 mils (0.0025 inches), and even no more than 2.0 mils (0.002 inches). Moreover, the conductive pads 138, 140, 144, 148, and 150 may have an average thickness of no more than 3.2 mils (0.0032 inches), no more than 2.5 mils (0.0025 inches), and even no more than 2.0 mils (0.002 inches). In the exemplary embodiment, radial thickness 152 of first via sidewall 136 is about 5 mils (0.005 inches), radial thickness 154 of second via sidewall 142 is about 3 mils (0.003 inches), and radial thickness 156 of third via sidewall 146 is about 1 mil (0.001 inches). Moreover, in the exemplary embodiment, each of conductive pads 138, 140, 144, 148, and 150 has a thickness of no more than 3.2 mils (0.0032 inches). Moreover, in the exemplary embodiment, first conductive layer 110 and second conductive layer 112 each have a thickness of no more than 3.2 mils (0.0032 inches).

Moreover, via sidewalls of conductive vias 128 are substantially straight or vertical cylindrical sidewalls, and are not tapered, in contrast to microvias (i.e., vias having a diameter of less than 6 mils, usually about 1.5 mils) that are formed by laser drilling or other non-mechanical drilling means.

Moreover, in some embodiments, one or more of first via sidewall 136, second via sidewall 142, and third via sidewall 146 include a plurality of separate or distinct plating layers. The plating layers may be visually distinguishable from one another (e.g., when viewed under magnification) as a result of the plating processes used to deposit the plating layers. In the exemplary embodiment, first via sidewall 136 includes a first plating layer 158, a second plating layer 160, and a third plating layer 162, and second via sidewall 142 includes a first plating layer 164 and a second plating layer 166. Further, in the exemplary embodiment, third via sidewall 146 includes only a single plating layer 168. The radial thickness of each via sidewall is equal to the sum of thicknesses of each plating layer that make up the corresponding via sidewall.

Figure 2:
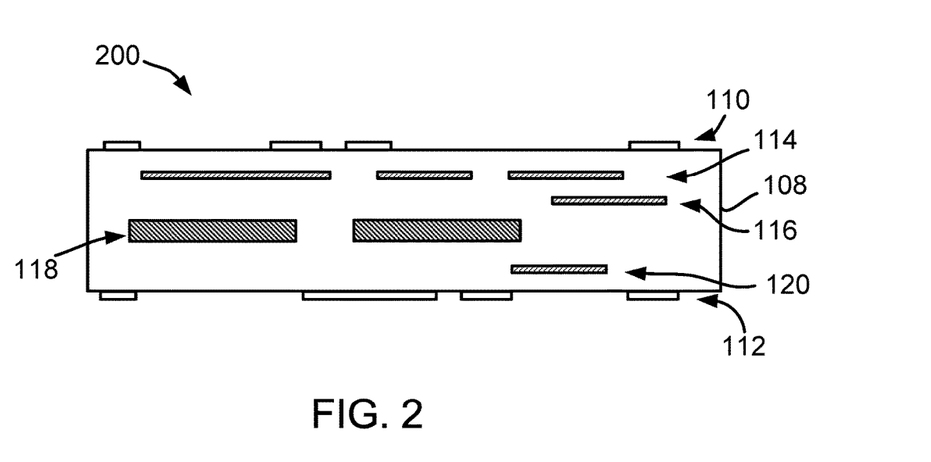
FIG. 2 is a cross-section of an exemplary printed circuit board substrate that may be used to manufacture the PCB assembly shown in FIG. 1

FIG. 2 is a cross-section of an exemplary printed circuit board (PCB) substrate 200 that may be used to manufacture PCB assembly 100 shown in FIG. 1. As shown in FIG. 2, PCB substrate 200 includes insulating member 108, first conductive layer 110, and second conductive layer 112. First conductive layer 110 and second conductive layer 112 are separated and spaced apart from one another by at least one insulating layer defined by the insulating member 108. PCB substrate 200 further includes third conductive layer 114, fourth conductive layer 116, fifth conductive layer 118, and sixth conductive layer 120. As shown in FIG. 2, conductive vias 128 (shown in FIG. 1) have not been formed in the PCB substrate 200. FIGS. 3-8 show the PCB substrate 200 at sequential processing steps of an exemplary method of manufacturing printed circuit board 102 (shown in FIG. 1). In the exemplary embodiment, first conductive layer 110 and second conductive layer 112 are patterned to define conductive traces 122 prior to the formation of conductive vias 128. In other embodiments, first conductive layer 110 and/or second conductive layer 112 may be patterned during and/or after formation of conductive vias 128. Moreover, in some embodiments, a mask may be deposited or otherwise applied to first conductive layer 110 and/or second conductive layer 112 to prevent plating of the corresponding conductive layer during formation of conductive vias 128.

Figure 3:
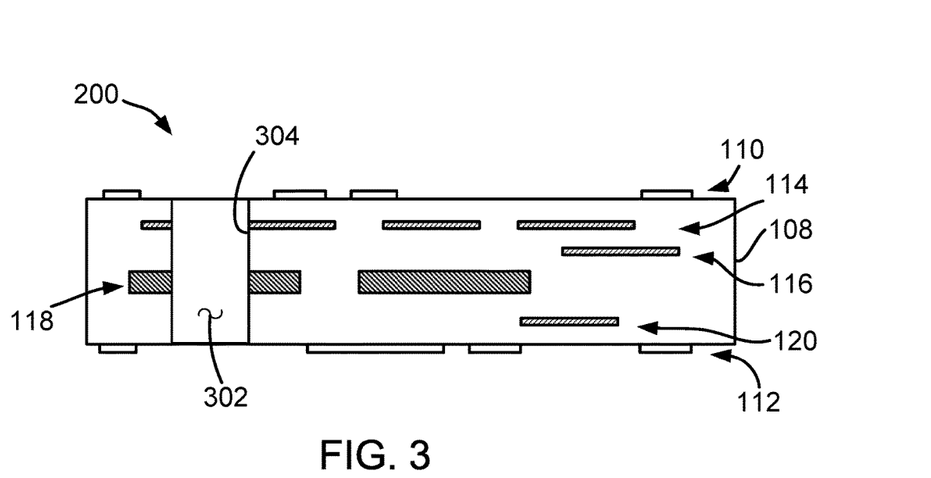
FIGS. 3-8 show the PCB substrate of FIG. 2 at various steps of an exemplary method of manufacturing a printed circuit board that may be used to manufacture the PCB assembly shown in FIG. 1.

As shown in FIG. 3, a first via hole 302 is formed in PCB substrate 200. First via hole 302 extends from first conductive layer 110 to second conductive layer 112, and is defined by a first cylindrical interior sidewall 304 of PCB substrate 200. In some embodiments, first via hole 302 is formed by a mechanical drilling process, for example, a rotary drilling process. In other embodiments, first via hole 302 may be formed using any suitable method that enables PCB assembly 100 to function as described herein. As compared to some methods of forming via holes, such as methods that use lasers to form via holes, mechanical drilling methods provide relatively, straight, vertical sidewalls that result in relatively straight, vertical via sidewalls upon formation of conductive vias.

Figure 4:
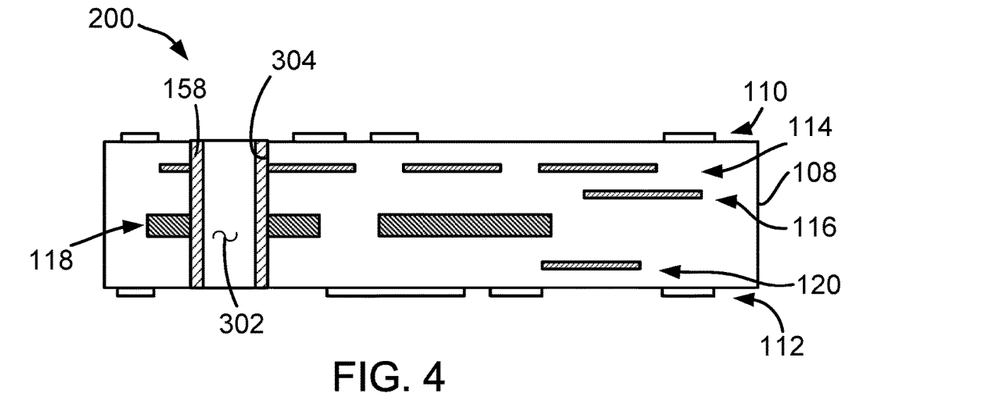

After first via hole 302 is formed, PCB substrate 200 is subjected to a first plating process during which first plating layer 158 of first via sidewall 136 (shown in FIG. 1) is deposited or formed on first interior sidewall 304 of PCB substrate 200, as shown in FIG. 4. Suitable plating processes for the first plating process include, for example and without limitation, direct current (DC) electroplating processes. In some embodiments, the first plating process includes a DC electroplating process in which a substantially constant DC voltage or current is continuously applied throughout the plating process. In other embodiments, the first plating process includes a DC electroplating process in which a DC voltage or current is applied intermittently or "pulsed" during the plating process, also referred to as a "pulse plating" process. As compared to standard DC electroplating processes, pulse plating processes facilitates maintaining a relatively thin outer conductive layer during via formation because the deposition rate within via holes is typically greater than the deposition rate on the outer conductive layers.

The first plating process is performed for a suitable amount of time to deposit a desired radial thickness of first plating layer 158. In some embodiments, the desired radial thickness of first plating layer 158 is calculated or estimated based on a desired final radial thickness of first via sidewall 136 and other plating processes performed subsequent to the first plating process. In some embodiments, for example, the desired radial thickness of first plating layer 158 is calculated or estimated based on an estimated or projected plating time to which PCB substrate 200 is subjected subsequent to the first plating process. Moreover, in some embodiments, the desired radial thickness of first plating layer 158 is calculated or estimated based on an estimated or projected plating thickness to be deposited in other conductive vias subsequent to the first plating process. For example, in the exemplary embodiment, the final desired radial thickness of first via sidewall 136 (shown in FIG. 1) is at least 5 mils (0.005 inches). Moreover, the desired final radial thicknesses of second via sidewall 142 and third via sidewall 146 (both shown in FIG. 1) are 3 mils (0.003 inches) and 1 mil (0.001 inches), respectively. Moreover, in the exemplary method, second via sidewall 142 and third via sidewall 146 are formed by plating processes performed subsequent to the first plating process. Thus, in the exemplary embodiment, PCB substrate 200 is subjected to one or more additional plating processes subsequent to the first plating process for a sufficient time to deposit at least 3 mils (0.003 inches) of conductive material for second via sidewall 142. The desired radial thickness of first plating layer 158 may be determined, for example, by subtracting the estimated or projected plating thickness to be deposited in other conductive vias subsequent to the first plating process (i.e., 3 mils) from the desired final radial thickness of first via sidewall (i.e., 5 mils).

Figure 5:
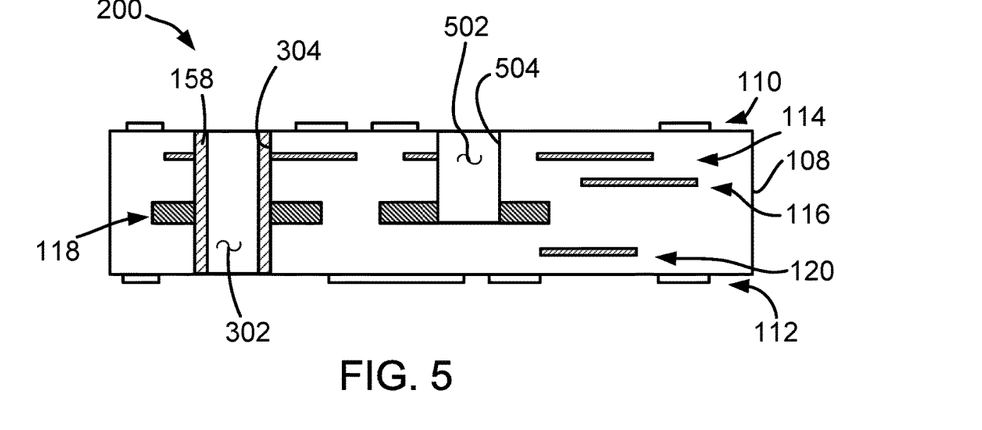

After the first plating process is completed, a second via hole 502 is formed in PCB substrate 200, as shown in FIG. 5. Second via hole 502 extends from first conductive layer 110 to fifth conductive layer 118, and is defined by a second cylindrical interior sidewall 504 of PCB substrate 200. In the exemplary embodiment, second via hole 502 has a smaller diameter than first via hole 302. Second via hole 502 may be formed in the same manner as first via hole 302. For example, in some embodiments, second via hole 502 is formed by a mechanical drilling process, for example, a rotary drilling process. In other embodiments, second via hole 502 may be formed using any suitable method that enables PCB assembly 100 to function as described herein.

Figure 6:
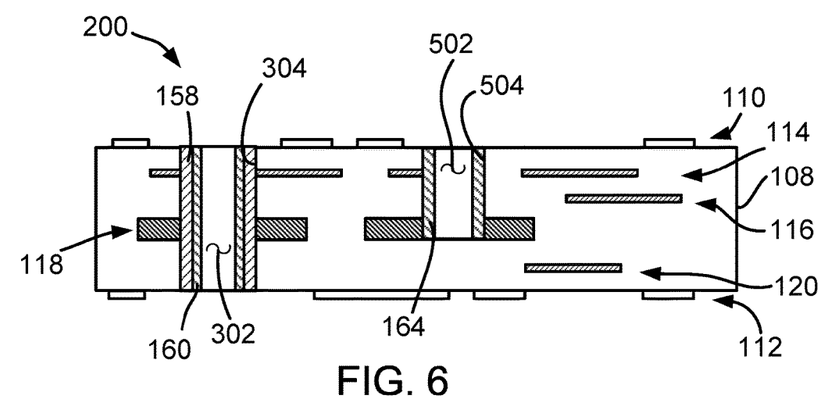

After second via hole 502 is formed, PCB substrate 200 is subjected to a second plating process during which first plating layer 164 of second via sidewall 142 is deposited or formed on second interior sidewall 504 of PCB substrate 200, as shown in FIG. 6. Moreover, during second plating process, second plating layer 160 of first via sidewall 136 is deposited or formed on first plating layer 158 of first via sidewall 136, as shown in FIG. 6. Suitable plating processes for the second plating process include the same plating processes described above with reference to the first plating process. In some embodiments, for example, the second plating process includes a DC electroplating processes, such as a pulse plating process.

The second plating process is performed for a suitable amount of time to deposit a desired radial thickness of first plating layer 164 of second via sidewall 142 and a desired radial thickness of second plating layer 160 of first via sidewall 136. The desired radial thicknesses of first plating layer 164 of second via sidewall 142 and/or second plating layer 160 of first via sidewall 136 may be calculated or estimated in the same manner described above with reference to the first plating process. In some embodiments, for example, the desired radial thickness of first plating layer 164 of second via sidewall 142 may be calculated or estimated based on a desired final radial thickness of second via sidewall 142 and other plating processes performed subsequent to the second plating process. Moreover, in some embodiments, the desired radial thickness of second plating layer 160 of first via sidewall 136 may be calculated or estimated based on a desired final radial thickness of first via sidewall 136 and other plating processes performed subsequent to the second plating process.

For example, in the exemplary embodiment, the final desired radial thicknesses of first via sidewall 136 and second via sidewall 142 are at least 5 mils (0.005 inches) and at least 3 mils (0.003 inches), respectively. Moreover, the desired final radial thickness of third via sidewall 146 (shown in FIG. 1) is 1 mil (0.001 inches). Moreover, in the exemplary method, third via sidewall 146 is formed by one or more plating processes performed subsequent to the second plating process. Thus, in the exemplary embodiment, PCB substrate 200 is subjected to one or more additional plating processes subsequent to the second plating process for a sufficient time to deposit at least 1 mil (0.001 inches) of conductive material for third via sidewall 146. The desired radial thickness of first plating layer 164 of second via sidewall 142 may be determined, for example, by subtracting the estimated or projected plating thickness to be deposited in other conductive vias subsequent to the second plating process (i.e., 1 mil) from the desired final radial thickness of second via sidewall 142 (i.e., 3 mils).

Figure 7:
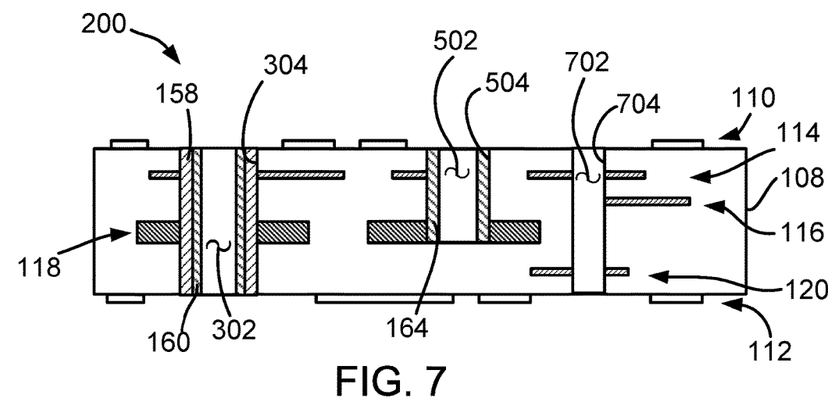

After the second plating process is completed, a third via hole 702 is formed in PCB substrate 200, as shown in FIG. 7. Third via hole 702 extends from first conductive layer 110 to second conductive layer 112, and is defined by a third cylindrical interior sidewall 704 of PCB substrate 200. Third via hole 702 may be formed in the same manner as first and second via holes 302 and 502. For example, in some embodiments, third via hole 702 is formed by a mechanical drilling process, for example, a rotary drilling process. In other embodiments, third via hole 702 may be formed using any suitable method that enables PCB assembly 100 to function as described herein.

Figure 8:
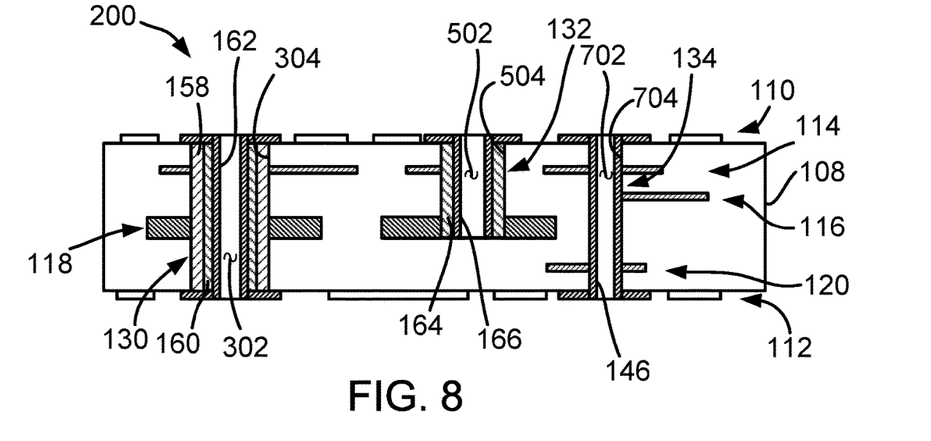

After third via hole 702 is formed, PCB substrate 200 is subjected to a third plating process during which third via sidewall 146 is deposited or formed on third interior sidewall 704 of PCB substrate 200, as shown in FIG. 8. Moreover, during third plating process, third plating layer 162 of first via sidewall 136 is deposited or formed on second plating layer 160 of first via sidewall 136, and second plating layer 166 of second via sidewall 142 is deposited or formed on first plating layer of second via sidewall 142, as shown in FIG. 8. Suitable plating processes for the third plating process include the same plating processes described above with reference to the first and second plating processes. In some embodiments, for example, the third plating process includes a DC electroplating processes, such as a pulse plating process.

The third plating process is performed for a suitable amount of time to deposit a desired radial thickness of third via sidewall 146. In the exemplary embodiment, third via 134 has the smallest wall thickness of all the conductive vias of printed circuit board 102, and the third plating process is the final via plating process performed on printed circuit board 102. Accordingly, the plating time for the third plating process may be calculated or determined based on the final desired radial thickness of third via sidewall 146 and a known or calculated deposition rate for the third plating process.

In some embodiments, via conductive pads 138, 140, 144, 148, and 150 (shown in FIG. 1) may also be formed during the third plating process. That is, via conductive pads 138, 140, 144, 148, and 150 may be formed concurrently with third plating layer 162 of first via sidewall 136, second plating layer 166 of second via sidewall 142, and/or third via sidewall 146. In other embodiments, via conductive pads 138, 140, 144, 148, and 150 may be formed prior to or after the third plating process.

Moreover, in some embodiments, the third or final via plating process may be used to form a smooth, outer plating layer on first conductive layer 110 and/or second conductive layer 112. In some embodiments, for example, a mask covering first conductive layer 110 and/or second conductive layer 112 may be removed prior to the third plating process such that the third plating process forms an outer plating layer on at least one of first conductive layer 110 and second conductive layer 112.

In some embodiments, the amount of conductive material deposited or formed on one conductive via may vary from the amount of conductive material deposited or formed on another conductive via during the same plating process. For example, in pulse plating processes, fluid dynamics within relatively large via holes result in greater deposition rates than in smaller via holes. Consequently, the amount of conductive material deposited on conductive vias associated with relatively larger via holes may be greater than the amount of conductive material deposited on conductive vias associated with relatively smaller via holes during a single pulse plating process. In the exemplary embodiment, for example, the radial thicknesses of third plating layer 162 of first via sidewall 136 and second plating layer 166 of second via sidewall 142 may be greater than the radial thickness of third via sidewall 146, even though all are formed during the third plating process.

In the exemplary embodiments, each of conductive vias 128 has a generally hollow, tubular configuration. In some embodiments, one or more of conductive vias 128 may be filled (e.g., with a conductive paste) and plated shut with a conductive plate or pad.

Once printed circuit board 102 is manufactured, electronic components, such as electronic component 104 (shown in FIG. 1) may be electrically coupled to one or more of conductive vias 128 either directly to a conductive pad associated with one of conductive vias 128 or indirectly through one or more conductive traces 122 of printed circuit board 102.

Figure 9:
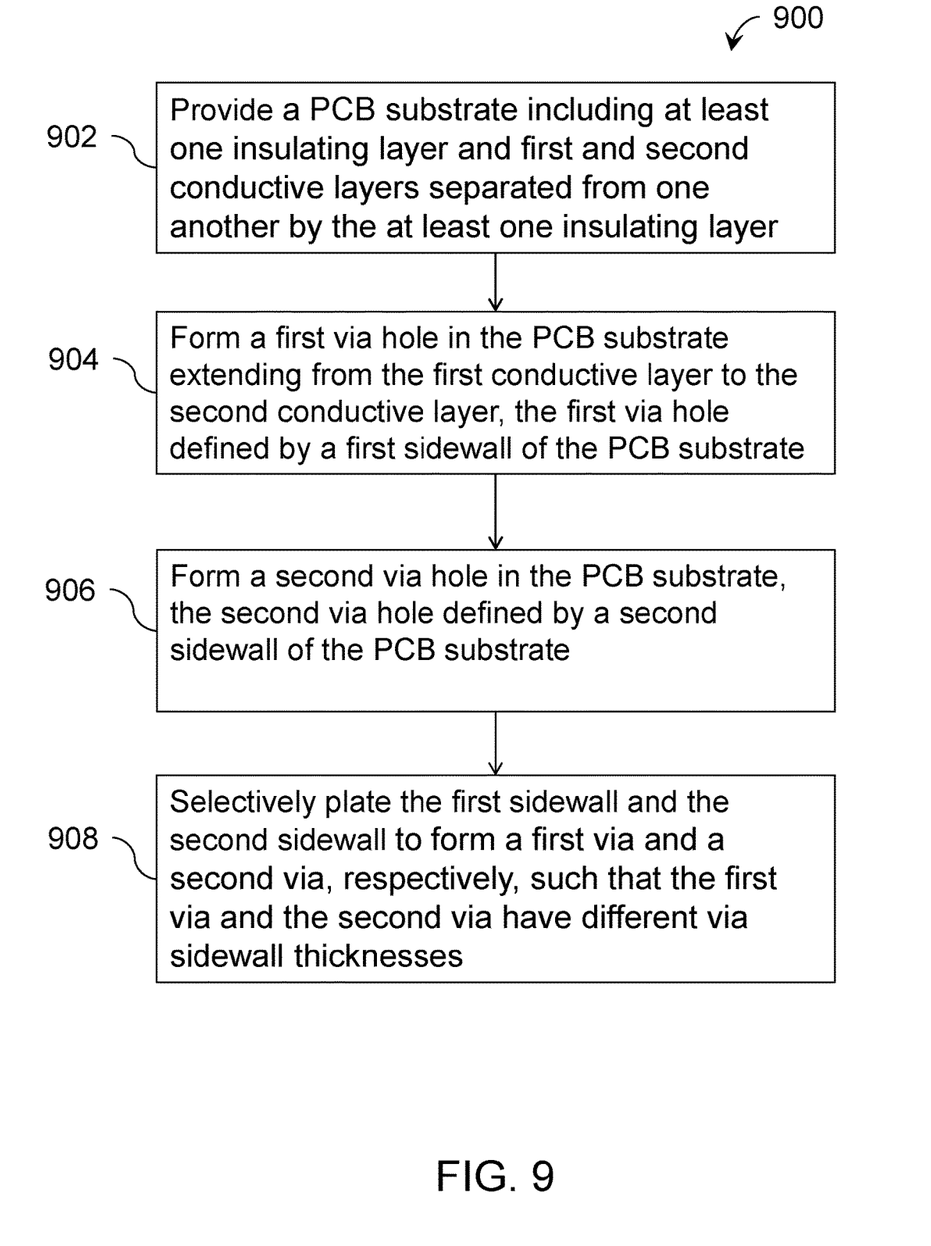
FIG. 9 is a flowchart of an exemplary method of manufacturing a printed circuit board that may be used to manufacture the PCB assembly shown in FIG. 1.

FIG. 9 is a flowchart of an exemplary method 900 of manufacturing a printed circuit board, such as printed circuit board 102 (FIG. 1). A printed circuit board (PCB) substrate, such as PCB substrate 200, including at least one insulating layer and first and second conductive layers separated from one another by the at least one insulating layer is provided 902. A first via hole, such as first via hole 302 (FIG. 3), is formed 904 in the PCB substrate extending from the first conductive layer to the second conductive layer. The first via hole is defined by a first sidewall of the PCB substrate. A second via hole, such as second via hole 502 (FIG. 5) is formed 906 in the PCB substrate. The second via hole is defined by a second sidewall of the PCB substrate. The first sidewall and the second sidewall of the PCB substrate are selectively plated 908 to form a first via and a second via, respectively, such that the first via and the second via have different via sidewall thicknesses.

In some embodiments, forming 904 the first via hole includes mechanically drilling the first via hole in the PCB substrate, and forming 906 the second via hole includes mechanically drilling the second via hole in the PCB substrate. Suitable mechanical drilling processes include, for example and without limitation, rotary drilling. Moreover, in some embodiments, forming 906 the second via hole includes forming the second via hole such that the second via hole extends from at least one of the first conductive layer and the second conductive layer. Moreover, in some embodiments, forming 906 the second via hole in the PCB substrate includes forming the second via hole such that the second via hole has a smaller diameter than the first via hole.

In some embodiments, selectively plating 908 the first sidewall and the second sidewall includes selectively plating the first sidewall and the second sidewall such that at least one of the first via and the second via has a via sidewall with an average radial thickness of at least 2.5 mils (0.0025 inches), and a conductive pad with an average thickness of no more than 3.2 mils (0.0032 inches).

In some embodiments, selectively plating 908 the first sidewall and the second sidewall includes performing a first plating process on the PCB substrate, prior to the second via hole being formed, to deposit a first plating layer on the first sidewall, and performing a second plating process on the PCB substrate, subsequent to the second via hole being formed, to deposit a second plating layer on the first plating layer and a third plating layer on the second sidewall. Moreover, in such embodiments, method 900 may further include determining a radial thickness of the first plating layer to be deposited during the first plating process based on an estimated plating time of at least one other plating process performed subsequent to the first plating process. Moreover, in some embodiments, method 900 may further include forming a third via hole in the PCB substrate subsequent to the second plating process, where the third via hole is defined by a third sidewall of the PCB substrate, and performing a third plating process on the PCB substrate to deposit a fourth plating layer on the second plating layer, a fifth plating layer on the third plating layer, and a sixth plating layer on the third sidewall. In some embodiments, performing the first plating process and performing the second plating process may include depositing the first plating layer and depositing the second plating layer such that a combined radial thickness of the first and second plating layers is at least 2.5 mils (0.0025 inches). Moreover, in some embodiments, at least one of the first plating process and the second plating process includes a pulse plating process. Further, in some embodiments, providing 902 a printed circuit board (PCB) substrate may include providing a PCB substrate wherein at least one of the first conductive layer and the second conductive layer is covered by a mask. Further, in such embodiments, method 900 may further include removing the mask subsequent to the first plating process, and performing the second plating process may further include forming an outer plating layer on at least one of the first conductive layer and the second conductive layer.

In some embodiments, method 900 may further include electrically coupling an electronic component, such as electronic component 104 (FIG. 1), to at least one of the first via and the second via. In such embodiments, electrically coupling an electronic component may include electrically coupling at least one of a transformer, an inductor, and a power MOSFET to at least one of the first via and the second via.

As compared to some known printed circuit boards and methods of manufacturing printed circuit boards, the printed circuit boards and methods described herein facilitate improving the power density, component density, and the efficiency of printed circuit boards. For example, printed circuit boards of the present disclosure include relatively thick-wall conductive vias capable of carrying relatively large currents. Thick-wall conductive vias have reduced electrical resistance as compared to thin-wall vias, and thereby provide lower resistive losses and generate relatively less resistive heating during operation as compared to thin wall. Moreover, thick-wall conductive vias facilitate improving board space utilization. For example, conductive vias of the present disclosure may be used in place of several thin-wall vias, which occupy a disproportionately large surface area of printed circuit boards as compared to the thick-wall vias described herein.

Additionally, in contrast to some known methods of manufacturing printed circuit boards, the methods described herein selectively plate conductive vias using a multi-step plating process in which one or more via holes are formed subsequent to at least one via plating process. The methods described herein thereby facilitate forming relatively thick via sidewalls while maintaining relatively thin outer conductive layers and thin via pads. Maintaining relatively thin outer conductive layers and via pads facilitates improving the minimum obtainable feature size in the outer conductive layers (e.g., conductive trace width and/or center-to-center spacing of conductive pads), and thereby facilitates use of fine pitch components.

Exemplary embodiments of printed circuit boards and methods of manufacturing printed circuit boards are described above in detail. The printed circuit boards and methods are not limited to the specific embodiments described herein but, rather, components of the printed circuit boards and/or operations of the methods may be utilized independently and separately from other components and/or operations described herein. Further, the described components and/or operations may also be defined in, or used in combination with, other systems, methods, and/or devices, and are not limited to practice with only the printed circuit boards described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of manufacturing a printed circuit board, said method comprising:
   providing a printed circuit board (PCB) substrate including at least one insulating layer and first and second conductive layers separated from one another by the at least one insulating layer;
   forming a first via hole in the PCB substrate extending from the first conductive layer to the second conductive layer, the first via hole defined by a first sidewall of the PCB substrate;
   forming a second via hole in the PCB substrate, the second via hole defined by a second sidewall of the PCB substrate; and
   selectively plating the first sidewall and the second sidewall to form a first via and a second via, respectively, wherein the first via and the second via have different via sidewall thicknesses, and wherein selectively plating the first sidewall and the second sidewall comprises:
      performing a first plating process on the PCB substrate, prior to the second via hole being formed, to deposit a first plating layer on the first sidewall; and
      performing a second plating process on the PCB substrate, subsequent to the second via hole being formed, to deposit a second plating layer on the first plating layer and a third plating layer on the second sidewall.

2. A method in accordance with claim 1, wherein selectively plating the first sidewall and the second sidewall comprises selectively plating the first sidewall and the second sidewall such that at least one of the first via and the second via has a via sidewall with an average radial thickness of at least 2.5 mils (0.0025 inches), and wherein the at least one of the first via and the second via further includes a conductive pad with an average thickness of no more than 3.2 mils (0.0032 inches).

3. A method in accordance with claim 1, further comprising determining a radial thickness of the first plating layer to be deposited during the first plating process based on an estimated plating time of at least one other plating process performed subsequent to the first plating process.

4. A method in accordance with claim 1, wherein performing the first plating process and performing the second plating process comprises depositing the first plating layer and depositing the second plating layer such that a combined radial thickness of the first and second plating layers is at least 2.5 mils (0.0025 inches).

5. A method in accordance with claim 1, further comprising:
   forming a third via hole in the PCB substrate subsequent to the second plating process, the third via hole defined by a third sidewall of the PCB substrate; and
   performing a third plating process on the PCB substrate to deposit a fourth plating layer on the second plating layer, a fifth plating layer on the third plating layer, and a sixth plating layer on the third sidewall.

6. A method in accordance with claim 1, wherein at least one of the first plating process and the second plating process comprises a pulse plating process.

7. A method in accordance with claim 1, wherein providing a printed circuit board (PCB) substrate includes providing a PCB substrate wherein at least one of the first conductive layer and the second conductive layer is covered by a mask, and wherein the method further comprises:
   removing the mask subsequent to the first plating process; and
   wherein performing the second plating process further includes forming an outer plating layer on at least one of the first conductive layer and the second conductive layer.

8. A method in accordance with claim 1, wherein forming a second via hole includes forming the second via hole such that the second via hole extends from at least one of the first conductive layer and the second conductive layer.

9. A method in accordance with claim 1, wherein forming the first via hole includes mechanically drilling the first via hole in the PCB substrate, and wherein forming the second via hole includes mechanically drilling the second via hole in the PCB substrate.

10. A method in accordance with claim 1, wherein forming the second via hole in the PCB substrate includes forming the second via hole such that the second via hole has a smaller diameter than the first via hole.

11. A method in accordance with claim 1, further comprising electrically coupling an electronic component to at least one of the first via and the second via.

12. A method in accordance with claim 11, wherein electrically coupling an electronic component comprises electrically coupling at least one of a transformer, an inductor, and a power MOSFET to at least one of the first via and the second via.

* * * * *